United States Patent [19]

Bremenour et al.

[11] Patent Number: 4,945,448
[45] Date of Patent: Jul. 31, 1990

[54] MEMORY CARTRIDGE FOR A CIRCUIT BOARD MODULE

[75] Inventors: Edwin L. Bremenour, Euclid; Michael F. Tratar; Gerald S. Pepera, both of Mentor, all of Ohio

[73] Assignee: Allen-Bradley Company, Inc., Milwaukee, Wis.

[21] Appl. No.: 325,220

[22] Filed: Mar. 17, 1989

[51] Int. Cl.⁵ .......................... H05K 7/20; H05K 1/14
[52] U.S. Cl. ..................................... 361/383; 361/395; 361/399; 364/704; 365/52
[58] Field of Search ........ 361/380, 383, 384, 391–395, 361/399, 413; 364/704; 365/52, 226, 229

[56] References Cited

U.S. PATENT DOCUMENTS

| | | | |
|---|---|---|---|
| 3,547,274 | 12/1970 | Sosinkski | 361/394 |
| 4,216,522 | 8/1980 | Slagel et al. | 361/392 |
| 4,295,181 | 10/1981 | Chang et al. | 361/395 |
| 4,482,938 | 11/1984 | Norden | 361/394 |
| 4,502,130 | 2/1985 | Kuckuk | 365/52 |
| 4,531,176 | 7/1985 | Beecher, II | 361/424 |
| 4,580,192 | 4/1986 | Beun | 361/395 |
| 4,593,376 | 6/1986 | Volk | 364/900 |
| 4,596,390 | 6/1986 | Studley | 273/148 B |
| 4,620,707 | 11/1986 | Lippincott | 273/148 B |
| 4,628,413 | 12/1986 | Speraw | 361/415 |
| 4,628,457 | 12/1986 | Manduley | 364/464 |
| 4,648,066 | 3/1987 | Pitt | 364/900 |
| 4,654,818 | 3/1987 | Wetterau, Jr. | 364/900 |
| 4,654,829 | 3/1987 | Jiang et al. | 365/229 |
| 4,763,300 | 8/1988 | Yukawa | 365/52 |

FOREIGN PATENT DOCUMENTS

| | | | |
|---|---|---|---|
| 0087788 | 9/1983 | European Pat. Off. | 361/392 |
| 3533419 | 3/1987 | Fed. Rep. of Germany | 361/399 |
| 3630397 | 3/1988 | Fed. Rep. of Germany | |

*Primary Examiner*—Gregory D. Thompson
*Attorney, Agent, or Firm*—Quarles & Brady

[57] ABSTRACT

A memory cartridge for convenient manual attachment of a RAM memory with battery back-up to an I/O module in a programmable controller system is inserted through an opening in a side cover of the I/O module and connected to a main circuit board. The housing has a pair of clip members on opposite ends with grooves running transversely across the ends to receive the edges of mounting flanges extending inward at upper and lower ends of an opening in the side cover. The clip members are yieldable in the longitudinal direction of the cartridge housing—to squeezed between a thumb and fingers of one hand—and when the cartridge is inserted through the side cover opening to a certain depth, the clip members are released to secure the cartridge between the mounting flanges.

10 Claims, 3 Drawing Sheets

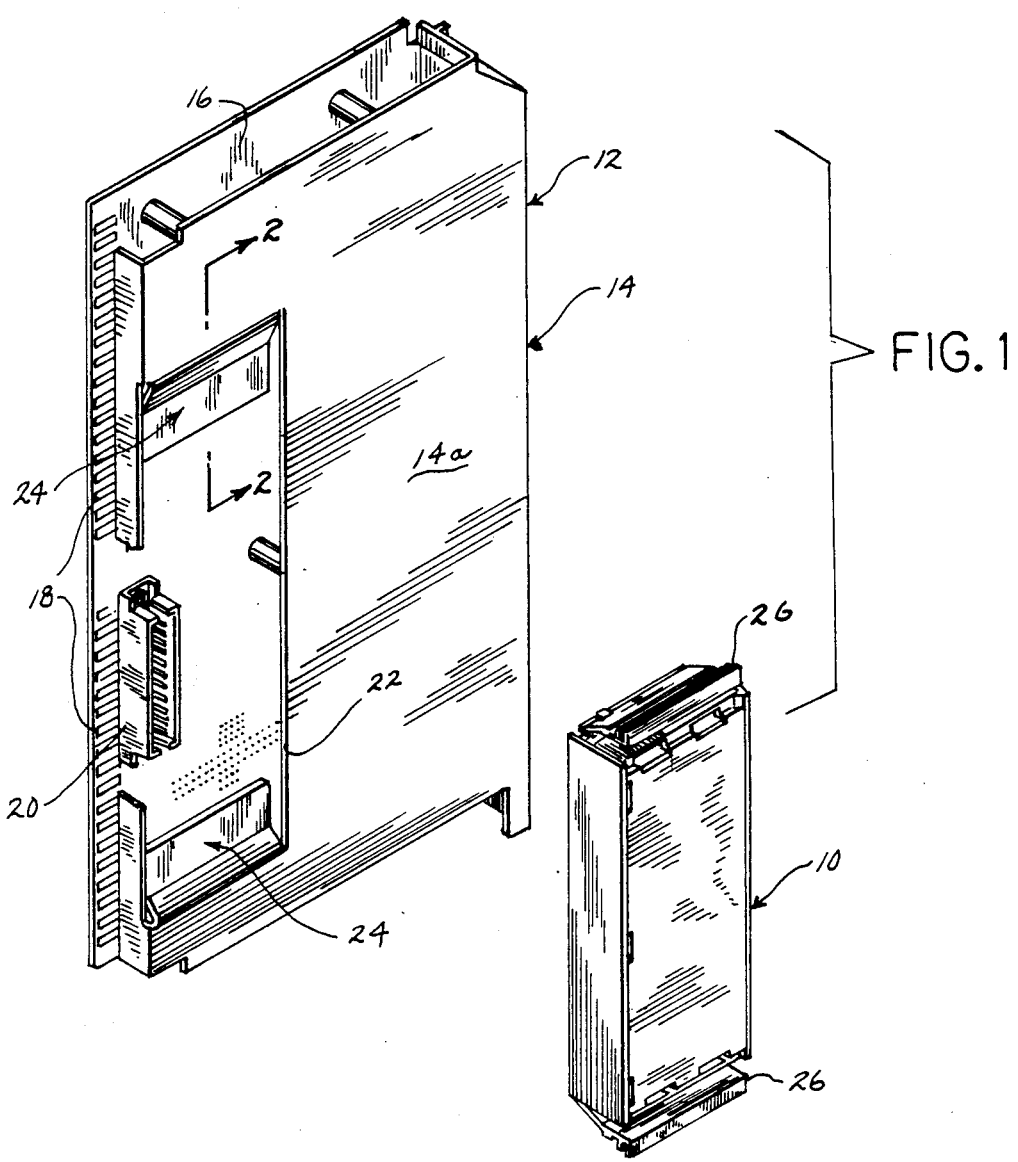
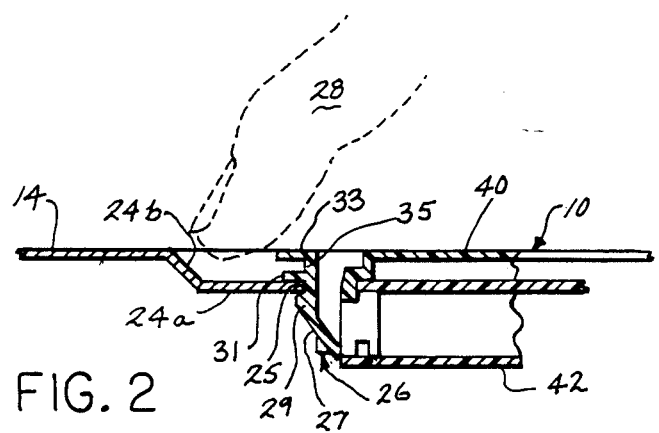

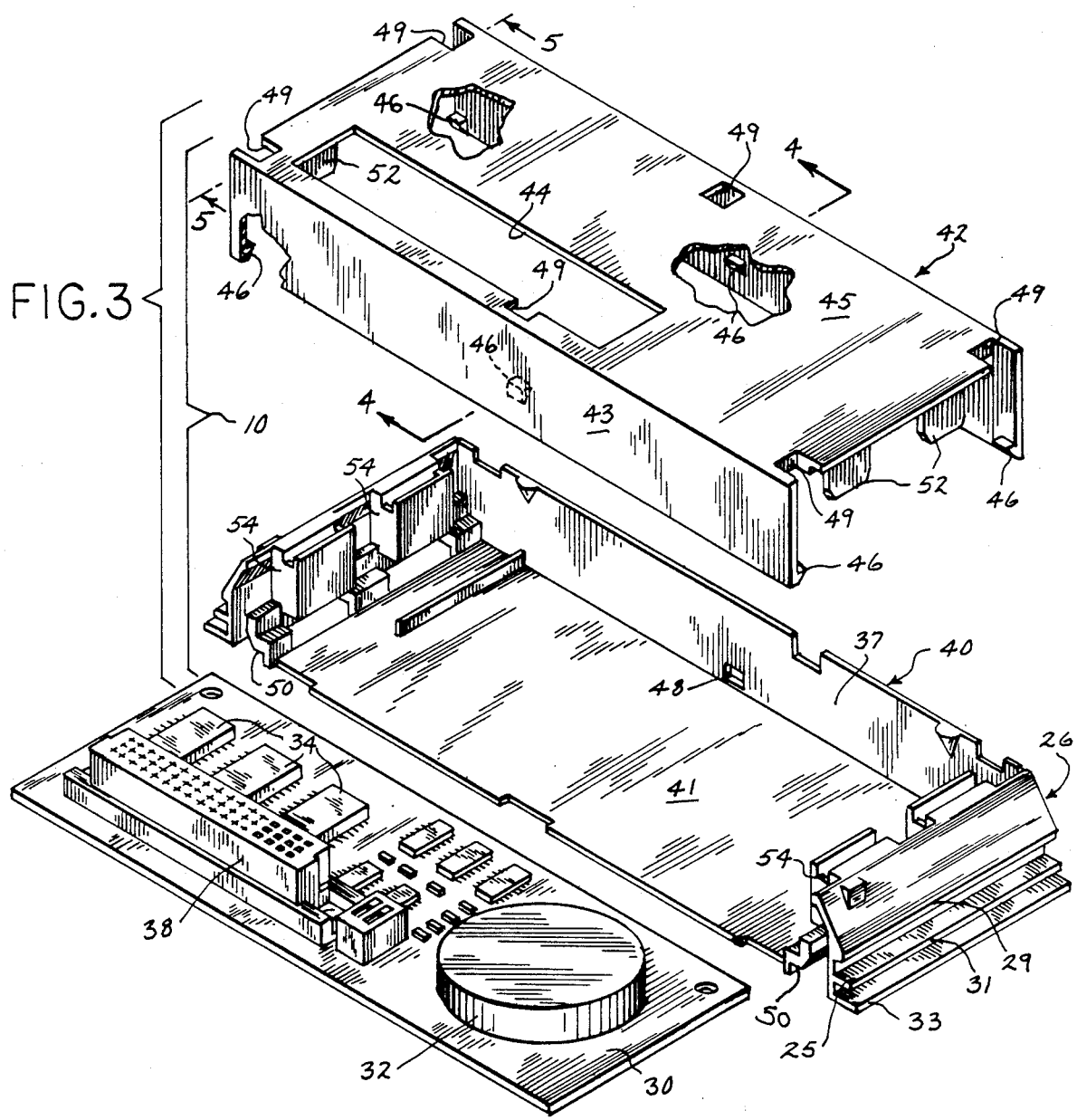
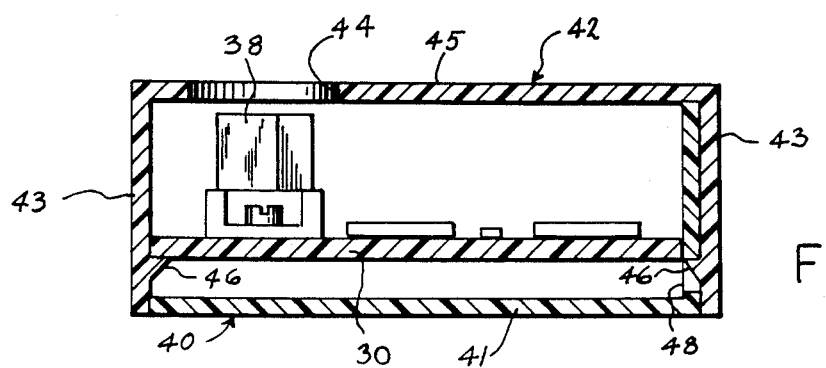

MEMORY CARTRIDGE FOR A CIRCUIT BOARD MODULE

BACKGROUND OF THE INVENTION

1. Field of the Invention.

The field of the invention is electronic controllers for controlling industrial machines and processes, and more particularly memory cartridges for circuit board modules used in such equipment and controllers.

2. Description of the Prior Art

Industrial controllers are typically connected to assembly line equipment and process control equipment in manufacturing facilities and other industrial plants. Smaller controllers, including programmable controllers, have typically been built as a set of modules that are inserted in a rack somewhat like a set of books placed side-by-side in a bookcase. These modules may include a main processor (CPU) module, communication modules and I/O interface modules.

I/O interface modules were originally developed as an isolation interface between the logic-level signals of the industrial controller (e.g. 5-volts DC) and the power-level signals (e.g. 120-volts AC) being supplied to the devices on the industrial equipment being controlled. More recently, these I/O modules have included peripheral processors which may perform very sophisticated control functions with periodic communication with the main processor (CPU) module.

In main processor modules it has been known to provide some type of replaceable programmable read-only memory (PROM) circuits so that the module can be reprogrammed. In some instances such PROM's have been placed on a small circuit board and within a small housing.

Where many different programs of a moderate complexity are to be stored and executed, it is desirable to store and execute them in random access memory (RAM). This allows convenience in loading, testing and debugging such programs. With cartridges, the programs can be developed with off-line development systems and later installed in the controller equipment.

Whereas PROM circuits are non-volatile, RAM circuits are volatile—their contents are lost when power is turned off. Many products therefore provide battery back-up for RAM circuits.

RAM cartridges have not been widely used, perhaps due to the size and complexity required in such a cartridge and the need to provide convenient installation.

There is a need to provide a RAM cartridge in a package that is convenient to install and remove from a circuit board module in industrial controller equipment. In such a cartridge, there is also a problem of the cartridge housing blocking the escape of heat both from the circuits in the cartridge itself and from the circuit board module into which the cartridge is installed.

SUMMARY OF THE INVENTION

This invention relates to a cartridge housing for a circuit cartridge that may be inserted through a side cover of a main circuit board module and connected to a main circuit board beneath the cover. The cartridge housing attaches between spaced, opposed mounting flanges extending towards one another and generally parallel to a main panel of the side cover.

The cartridge housing includes a pair of clip members at opposite ends, the clip members each including a groove for receiving and engaging a respective mounting flange. At least one and preferably both of the clip members are yieldable in the longitudinal direction of the cartridge housing. The length of the cartridge is inserted through the side cover opening to a certain depth, where the yieldable clip members are pressed into position to secure the cartridge between the mounting flanges.

One object of the invention to provide a RAM memory cartridge that is convenient to install and remove with one hand on the cartridge and the other hand on the main module. The cartridge is snapped into place by squeezing the yieldable clip members between a thumb on one end and the fingers on the other end. The length of the cartridge is preferably in the range of 5 to 6 inches in length so as to fit the average adult human hand.

Besides its length, the cartridge also provides for convenient handling by providing gripping extensions on the ends of the clip members.

The clip members and the mounting flanges are arranged to control the depth of insertion of the cartridge, so that in the installed position, the outer housing panel is flush with the main body of the housing cover.

The cartridge housing is preferably an assembly of a cover and a base, and therefore the housing also provides convenient features for locating and attaching these two components.

Another object of the invention is to provide proper ventilation of the cartridge and also to allow cooling air flow from the underlying main circuit board module.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1 is an exploded perspective view of the RAM cartridge and the I/O module showing their orientation prior to connection;

FIG. 2 is an enlarged sectional view along line 2—2 in FIG. 1 showing the engagement of the flexible positioning clips of the cartridge of FIG. 1 with the positioning flange of the I/O module of FIG. 1;

FIG. 3 is an exploded view of the cartridge of FIG. 1;

FIG. 4 is a sectional view along lines 4—4 of FIG. 3;

DETAILED DESCRIPTION OF THE PREFERRED EMBODIMENT

Figure 5:
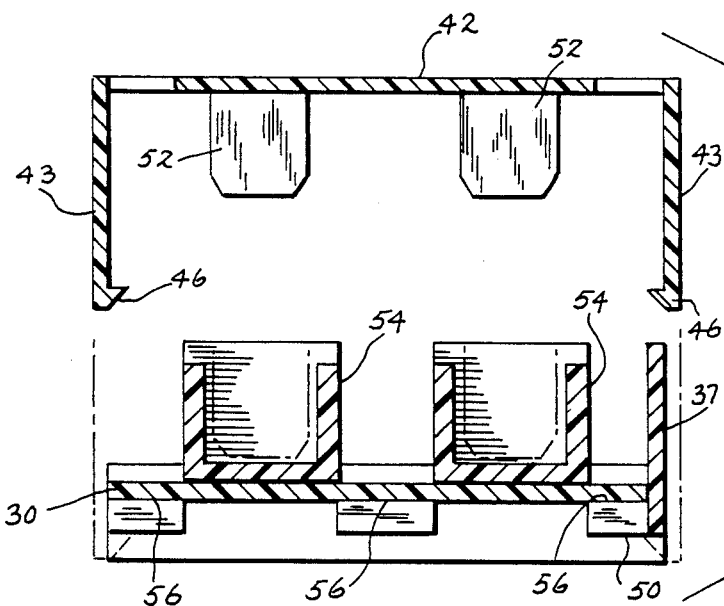
FIG. 5 is a sectional view along lines 5—5 of FIG. 3.

FIG. 1 shows an I/O module 12 of the type which is inserted in an equipment rack in a programmable controller system. The I/O module 12 has a main circuit board 16 with edge termination areas 18 that are received in an edge connector (not shown) on a rack backplane when the I/O module 12 is plugged in for operation. A cover 14 is mounted to the circuit board 16 to enclose its circuitry and to shield it from similarly constructed adjacent circuit modules in the rack.

The cover 14 is formed with a vertically extending, rectangular opening 22. The cover 14 is also formed with mounting flanges 24 at upper and lower ends of the opening 22. These flanges 24 extend inwardly towards each other and towards the center of the opening 22 and include main portions 24a extending generally parallel to a main panel 14a of the cover 14. The flanges 24 also include connecting portions 24b that extend inwardly towards the circuit board 16 to position the main portions 24a in a recessed position relative to the main panel 14a. Seen through the opening is a male electrical connector 20 mounted on the circuit board 16 with a plurality of pins projecting upward within an insulating shell.

The invention relates to a memory cartridge 10, with electrical components mounted on an auxiliary circuit board 30 as illustrated in FIG. 3 These components include RAM memory circuits 34, which in this embodiment include three 32K by 8-bit static read-only-memories (SRAM). Also mounted on the circuit board 30 and included in the circuit are some power-up/power-down circuitry, a disc-shaped, lithium cell, backup battery 32 and a female electrical connector 38.

The backup battery 32 is electrically connected through the circuit board 30 to power the RAM circuits 34 when the cartridge 10 and RAM circuits 34 are disconnected and removed from the I/O module 12 for transportation. This battery power preserves the contents of the RAM circuits 34, making the memory non-volatile.

The female electrical connector 38 is plugged into the male connector 20 on the main circuit board module 12 to connect the circuitry on the auxiliary circuit board 30 to circuitry on the main circuit board 16. It should be understood that the auxiliary circuit board 30 is thus mounted in a position with its circuit side facing in toward the circuit side of the main circuit board 16.

To connect the two circuit boards 16, 30, the memory cartridge 10 is inserted into the side opening in the cover 14 as seen in FIG. 1 The electrical connector 20 in FIG. 1 is received through an opening 44 in the cartridge housing illustrated in FIGS. 3 and 4. The opening exposes and allows access to its mating connector 38 which is seen below the opening 44 in FIG. 4.

The direction of insertion (the direction of the depth of the cartridge 10 and the thickness of the module 18) will be used as one reference relative to the cartridge 10 and the module 12. The other two directions shall be defined as the direction of extension of the cartridge along its length (the longitudinal direction) and the direction of extension of the cartridge across its width (the transverse direction).

Referring again to FIG. 3, the memory cartridge 10 has a housing comprised of two pieces, a base 42 and a cover 40. As seen in FIG. 3, the housing has been flipped over to view the underside of the cover 40 and bottom side of the base 42. Each piece 40 and 42 is integrally formed of a suitable plastic material using injection molding processes. A preferred material is CE Valox 347 polyester.

Figure 6:
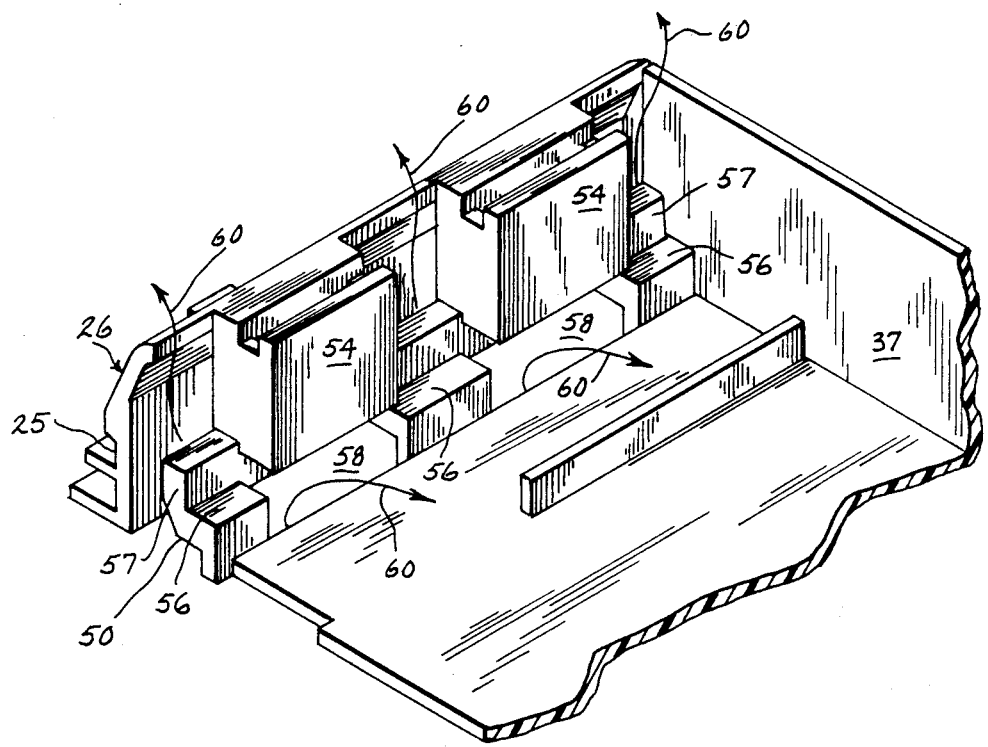
FIG. 6 is a perspective view of the inside end of the cartridge frame of the cartridge of FIG. 1 showing air circulation paths.

The cover 40 has a rectangular panel 41 which becomes the top panel of the cartridge housing. Along the right side, a sidewall 37 extends from one end of the cover 40 to the other. The sidewall 37 has an aperture 48 for receiving a barb 46 on a sidewall 43 of the base 42. Referring to FIGS. 3 and 6, at each end of the panel 41 are three L-shaped ledge members 56, one at each corner and one in the middle. These members 56 are spaced from each other to provide two vents 58 at each end for ventilating the underside of the circuit board 30, which is slidably received on the ledge members 56. A cross piece 57 extends transversely across the tops of the ledge members 56 to support a pair of spaced guide blocks 54. The guide blocks 54 are formed with channels opening upwardly as seen in FIGS. 3 and 6. A clip member 26 extends transversely across the outer sides of the guide blocks 54 and is integrally attached to the guide blocks 54. As seen in FIG. 2, the clip member 26 extends upwardly and outwardly through a sloped portion 27 to a mounting flange detent 29 and then to a groove 25 formed by the space between the detent 29 and horizontal stop flange 31. A second groove 35 separates the stop flange 31 from a gripping flange 33. The sloped portion 27, the groove 25, the detent 29 and the stop flange 31 all extend transversely across the end of the cover 40.

Referring again to FIG. 3, the base 42 has two sidewalls 43 extending between its ends which are open. A second barb 46 is located on the left sidewall opposite the barb 46 on the right sidewall 43. Four additional barbs 46 are located at the corners of the sidewalls 43 which are farthest from a panel 45 that forms the cartridge housing bottom panel. The opening 44 that exposes the connector 38 is formed along the left sidewall towards one end of the panel 45. Openings 49 are formed near the four corners of the panel 45 and midway along the right sidewall 43 for ventilation and for access to portions of the cartridge 10 during disassembly. Spaced inwardly from the ends of the panel 45 are two transversely spaced blades 52 which extend perpendicularly from the inner side of the panel 45.

Before attaching the base 42 to the cover 40, the circuit board 30 with its associated circuitry is slidably inserted in a slot formed between the ledge members 56 and the bottoms of the guide blocks 54. A foam pad (not shown) is placed on the underside of base 42 and captured between the battery 32 and the underside of the base 42. The base 42 is formed with an annular ridge (not shown) to hold the pad from slipping sideways off the top of the battery 32.

In attaching the base 42 to the cover 40, the base 42 is located by inserting the blades 52 in the channels of the guide blocks 54. The sidewalls 43 of the base 42 are pressed down over the sidewall 37 and corner ledge members 56 of the cover 40 with the sidewalls 43 flexing outward to allow the corner barbs 46 to slide into position on ledges 50 formed on the outer sides of the ledge members 56 as seen in phantom in FIG. 5. The barb 46 on the right sidewall 43 is received in aperture 48 as seen in FIG. 4 and the barb 46 on the left sidewall 43 is hooked to the underside of the circuit board 0 also seen in FIG. 4. When the cartridge is assembled, the connection provided by barb 46 and aperture 48 is hidden beneath panel 41 to secure the cartridge against easy disassembly. The assembled cartridge 10 is now ready for installation in the I/O module 12.

Referring to FIGS. 1 and 2, the memory cartridge 10 is inserted along its length into opening 22 in the insertion direction. The position of the opening 44 (shown in FIG. 3) on the underside of the cartridge 10 assures the proper orientation of the upper and lower ends of the cartridge 10. The installer places a thumb 28 on the gripping flange 33 at one end of the housing and one or more fingers on the gripping flange 33 at the other end of the housing to squeeze the clip members longitudinally inward and towards each other to aid insertion. At the same time the installer presses the cartridge through the opening 22 until the pins of connector 20 are received into sockets in connector 38.

During insertion, the sloped land portion 27 rides along the inner edge of mounting flange 24 helping to center the memory cartridge 10 between the mounting flanges 24. Longitudinal inward pressure against the sloped land 27 bends the clip members 26 toward the body of the memory cartridge 10 to assist in the engagement of flange detent 29. At each end of the rectangular opening 22 the edge of each mounting flange 24 is received in the groove 25 formed between the raised flange detent 29 and the insertion stop 31. Insertion stop 31, which has no preceding sloped land, prevents insertion to a greater depth regardless of possible continued pressure in the insertion direction. The upper side of the flange detent 29, facing the insertion stop 31 and groove 25, is also sloped but more abruptly than land 27 so as to resist uncoupling forces opposite the insertion direction. The gripping flanges 33 are released to permit final seating of the edges of the mounting flanges 24 in the grooves 25.

To remove the cartridge 10, gripping flanges 33 may again be compressed longitudinally inward by thumb and finger pressure with a pulling action opposite the insertion direction. This in turn compresses the clip members 26 against the body of the memory cartridge 10, disengaging flange detent 29 and groove 25 from the mounting flange 24 so that the memory cartridge 10 may be removed.

The offset of mounting flanges 24 beneath the panel of the I/O module cover controls the depth of insertion of the memory cartridge 10. It also provides for a positioning of the cartridge housing top panel flush with the I/O module cover. This prevents interference with other I/O modules installed in the rack.

The support of the clip members 26 by the guide blocks 54 avoids the need for end walls on the cover 40. The lack of obstructing end walls permits air circulation, shown by arrows 60, through vents 58 at either end of the cover 40. The cover 40 is formed of injection molded plastic to provide electrical insulation, resilience, and the flexibility required of the clip members 26.

This has been a detailed description of a preferred embodiment of the invention. The invention can also be practiced with certain modifications of a type that are understood by those of ordinary skill in the art. For example only one of the opposing clips members need be flexible; one clip member may be rigidly attached. As another example, the RAM circuitry and battery could be replaced by other circuitry. Therefore, to apprise the public of the scope of embodiments contemplated by the invention, the following claims are made.

We claim:

1. A housing for a circuit cartridge, of the type including a circuit board carrying electrical circuitry and an electrical connector on one side of the circuit board, for connection to a main circuit board module having a cover with a main panel and with spaced, opposed mounting flanges extending towards one another and generally parallel to the main panel, wherein:
   the housing extends in a longitudinal direction along the plane of the circuit board between two opposite ends and extends in the transverse direction perpendicular to the longitudinal direction and parallel to the plane of the circuit board; and
   wherein the housing includes a pair of clip members at the opposite ends of the housing, the clip members each including means for receiving and seating a respective mounting flange transversely extending across the ends of the housing, wherein the means for receiving and seating are located on the clip members to control depth of insertion, at least one clip member being yieldable in the longitudinal direction to allow insertion of the cartridge along its length and through an opening on the main circuit board module to the controlled depth of insertion, where the mounting flanges are seated in the clip member to secure the cartridge therebetween.

2. A circuit cartridge of claim 1, wherein the clip members are spaced a distance between a thumb on one end and fingers on the other end of an average adult human hand to be gripped thereby.

3. A cartridge housing for supporting an auxiliary circuit board for insertion into a side opening in a cover on a main circuit board module and for attachment between spaced, opposed mounting flanges on the cover extending towards one another and generally parallel to a main body of the cover, the cartridge housing comprising:
   a base including a bottom cartridge housing panel;
   a cartridge housing cover including a top cartridge housing panel, including means for slidably receiving and supporting the circuit board, the plane of the circuit board extending in the transverse and longitudinal directions in a position spaced below the top housing panel and spaced above the bottom housing panel;
   means for attachment of the cover to the base;
   the cartridge housing cover having clip members at opposite ends of the cartridge housing cover, at least one of the clip members being flexible to be urged inwardly towards the other clip member on an opposite end as the cartridge housing cover and base are inserted into an opening in the cover of the main circuit board module;
   wherein each clip member has edge-receiving means disposed transversely across a respective end of the cartridge housing cover to receive an edge of a respective mounting flange;
   wherein the flexible clip member has means located above its respective edge-receiving means for gripping and urging the flexible clip member towards the other clip member on an opposite end during insertion of the house cartridge between the mounting flanges; and
   wherein said means for gripping is releasable when the edge-receiving means are in alignment with the mounting flanges to receive the edges of the mounting flanges and secure the cartridge housing therebetween.

4. A cartridge housing of claim 3, wherein the clip members are each attached to a pair of spaced apart guide blocks at a respective end of the cartridge housing cover.

5. A cartridge housing of claim 3, wherein the means for attachment of the base to the cover comprises:
   the base having upwardly extending sidewalls with inwardly extending barbs formed at upper corners of the sidewalls;
   the cover having ledge members at the corners of the top cartridge housing panel; and wherein the sidewalls of the base are flexible to allow the barbs to slide up and over the ledge members on the cover to attach the base to the cover.

6. A cartridge housing of claim 3, wherein the clip members are spaced a distance between a thumb on one end and fingers on the other end of an average adult human hand, said flexible clip member being gripped and squeezed toward the another clip member during attachment of the cartridge housing to the main circuit board module.

7. A cartridge housing for supporting an auxiliary circuit board and for insertion into a side opening in a the main circuit board module,
   wherein each clip member has edge-receiving means disposed transversely across a respective end of the cartridge housing cover to receive an edge of a respective mounting flange,
   wherein the flexible clip member has means located above its respective edge-receiving means for gripping and urging the flexible clip member towards the other clip member on an opposite end during insertion of the housing cartridge between the mounting flanges, and
   wherein said means for gripping is releasable when the edge-receiving means are in alignment with the mounting flanges to receive the edges of the mounting flanges and secure the cartridge housing therebetween.

8. A cartridge housing of claim 7, wherein the edge-receiving means is formed on each end by a stop flange and a mounting flange detent which run parallel and transversely across each end of the cartridge housing cover and are spaced apart to define a transverse groove therebetween.

9. A cartridge housing of claim 7, wherein the means for attachment of the base to the cover comprises:
   the cover having one downwardly extending sidewall with a locking aperture located just below the position where the auxiliary circuit board is received; and
   the base having one sidewall extending upwardly along the sidewall of the cover, the base sidewall having a barb projecting therefrom and being flexible to allow the barb to slide into the locking aperture and through the cover sidewall, where it is hidden from view by the top cartridge housing panel.

10. A cartridge housing of claim 7, wherein the base includes alignment blades extending upwardly from the cartridge housing bottom panel, and wherein said guide blocks form channels for receiving the alignment blades and locating the base relative to the cover during assembly.

* * * * *

UNITED STATES PATENT AND TRADEMARK OFFICE
CERTIFICATE OF CORRECTION

PATENT NO. : 4,945,448

DATED : July 31, 1990

INVENTOR(S) : Edwin L. Bremenour, Michael F. Tratar & Gerald S. Pepera

It is certified that error appears in the above-identified patent and that said Letters Patent is hereby corrected as shown below:

Col. 7, line 12   After the words "opening in a" add the following:
--cover on a main circuit board module and for attachment between spaced, opposed mounting flanges on the cover extending towards one another and generally parallel to a main body of the cover, the cartridge housing comprising:

a base including a bottom cartridge housing panel;

a cartridge housing cover including a top cartridge housing panel, including means for slidably receiving and supporting the circuit board in a position spaced below the top housing panel and spaced above the bottom housing panel, the means for slidably receiving and supporting the circuit board including a plurality of ledge members at each end of the top housing panel, the ledge members supporting a bottom side of the auxiliary circuit board and being spaced transversely across each end of the top housing panel, so as together with the top housing panel, to define vents therebetween for ventilating a region along the bottom side of the auxiliary circuit board; and

UNITED STATES PATENT AND TRADEMARK OFFICE
CERTIFICATE OF CORRECTION

PATENT NO. : 4,945,448

DATED : July 31, 1990

INVENTOR(S) : Edwin L. Bremenour, Michael F. Tratar & Gerald S. Pepera

It is certified that error appears in the above-identified patent and that said Letters Patent is hereby corrected as shown below:

a plurality of guide blocks spaced transversely across each end of the top housing panel and spaced from the ledge members, the guide blocks having bottoms for containing a top side of the auxiliary circuit board;

means for attachment of the cover to the base;

the cartridge housing cover having clip members at opposite ends of the cartridge housing cover, at least one of the clip members being flexible to be urged inwardly towards the other clip member on an opposite end as the cartridge housing cover and base are inserted into an opening in the cover of--.

Signed and Sealed this

Eighteenth Day of February, 1992

Attest:

HARRY F. MANBECK, JR.

*Attesting Officer*        *Commissioner of Patents and Trademarks*